United States Patent
Chen

(10) Patent No.: US 6,803,834 B1
(45) Date of Patent: Oct. 12, 2004

(54) SIGMA-DELTA MODULATED DISCRETE TIME OSCILLATOR

(75) Inventor: Juinn-Yan Chen, Fremont, CA (US)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 10/442,921

(22) Filed: May 22, 2003

(51) Int. Cl.[7] .......................... H03B 28/00; H03L 7/099
(52) U.S. Cl. ....................................... 331/179; 331/1 A
(58) Field of Search ........................ 331/1 A, 18, 25, 331/177 R, 179

(56) References Cited

U.S. PATENT DOCUMENTS 6,208,211 B1 * 3/2001 Zipper et al. ................. 331/17

* cited by examiner

Primary Examiner—David Mis
(74) Attorney, Agent, or Firm—Rabin & Berdo, P.C.

(57) ABSTRACT

A sigma-delta modulated discrete time oscillator. The sigma-delta modulated discrete time oscillator comprises a synchronous counter and a sigma-delta modulator. The sigma-delta modulator operating in a first clock receives a control signal to generate a divider pattern output. The control signal provides a DC value for the frequency of the first clock. The divider pattern comprises a plurality of numbers, values of which are synchronous with the rate of the first clock. The synchronous counter operates in a second clock. In the synchronous counter, the second clock is divided by the divider pattern to generate the first clock. The frequency of the second clock is much higher than the frequency of the first clock.

10 Claims, 6 Drawing Sheets

SIGMA-DELTA MODULATED DISCRETE TIME OSCILLATOR

BACKGROUND OF THE INVENTION

1. Field of the Invention

The invention relates to a phase-locked loop system, and more particularly to a sigma-delta modulated discrete time oscillator.

2. Description of the Related Art

A typical video system uses frame sync (Vsync) or line sync (Hsync) signal for video timing. To digitize video analog signal, a clock recovery system is needed to regenerate an original pixel clock from Hsync signal or Vsync signal. The Hsync signal for video timing is taken for example to illustrate a typical analog PLL (phase-locked loop) system.

FIG. 1 is a block diagram illustrating a typical analog PLL system. The analog PLL system 100 comprises a phase detector 102, a charge-pump circuit 104, a low pass filter 106, a voltage-controlled oscillator 108 and a divider 110. The phase lock loop system 100 receives a Hsync signal $S_I$ for video timing. The frequency of the Hsync signal is around 15 kHz.

There is no Hsync signal for several lines in a video system for each frame. A typical analog PLL system needs to maintain an input clock of a voltage-controlled oscillator for several lines. The analog PLL system 100 uses the low pass filter 106 to maintain this input clock.

The low pass filter 106 is coupled to an output terminal of the charge-pump circuit 104. The output of the low pass filter 106 drives the voltage-controlled oscillator 108 to generate a required pixel clock $S_O$. The required pixel clock $S_O$ is fed back to the phase frequency detector 102 through the divider 110. The phase detector 102 receives the required pixel clock $S_O$ and the Hsync signal $S_I$ to generate a phase error output to the charge-pump circuit 104.

Because the frequency of the Hsync signal $S_I$ is around 15 KHz, the pole of the low pass filter 106 is kHz. Thus, values of components forming the low pass filter 106 such as capacitor or resistor are high. These components form an extra loop filter. The ground of the extra loop filter is physically different from analog ground of the voltage-controlled oscillator 108. Different ground noises generate jitter, with the most serious problem being long term jitter. Because the divisor of the divider 110 is too large, such as 1888 or 1716, the accumulated jitter will influence the detected result of the phase detector 102 after a period of the divisor.

To overcome this drawback, a digital PLL approach has been provided. FIG. 2 is a block diagram illustrating a typical digital PLL system. The digital PLL system 200 comprises a phase detector 202, a linear gain circuit 204, a digital low pass filter 206, a discrete time oscillator 208 and a clock divider 210. Using a high frequency fixed clock $S_c$, such as 135 MHz, generated by another analog PLL system with a smaller low pass filter, the analog clock recovery system can be replaced with digital implementation. Analog phase errors output from the phase detector 102 represented by Δt are replaced with digitized counter differences output from the phase detector 202. The charge-pump circuit 104 is replaced with the linear gain circuit 204. The analog low pass filter 106 for filtering high frequency unwanted signal is replaced by the digital low pass filter 206. Output of the digital low pass filter 206 and the control signal $S_c$ controls the discrete time oscillator 208 to generate a required pixel clock $S_O$.

The digital PLL approach can solve the problem of long term jitter. However, the traditional digital PLL approach suffers from inaccurate control values for the discrete time oscillator 208.

Therefore, what is needed is a way to accurately control a discrete time oscillator in a digital PLL system, unencumbered by the long term jitter.

SUMMARY OF THE INVENTION

It is an object of the present invention to provide a discrete time oscillator accurately controlled by a sigma-delta modulator in a digital PLL system.

It is another object of the present invention to provide a sigma-delta modulated discrete time oscillator used in a digital PLL system unencumbered by long term jitter.

The present invention thus provides a sigma-delta modulated discrete time oscillator. The sigma-delta modulated discrete time oscillator comprises a synchronous counter and a sigma-delta modulator. The sigma-delta modulator operating in a first clock receives a control signal to generate a divider pattern output. The control signal provides a DC value for the frequency of the first clock. The divider pattern comprises a plurality of numbers, values of which are synchronous with the rate of the first clock. The synchronous counter operates in a second clock. In the synchronous counter, the second clock is divided by the divider pattern to generate the first clock. The frequency of the second clock is much higher than the frequency of the first clock.

In another aspect of the invention, a phase-locked loop system is disclosed. The phase-locked loop system, comprises a phase detector, a digital low pass filter, a sigma-delta modulated discrete time oscillator and a clock divider. The phase detector receives a referenced clock and a feedback clock to find a phase error output. The digital low pass filter is coupled to the phase detector, for receiving the phase error to generate a control signal. The control signal provides a DC value for a frequency of a first clock. The sigma-delta modulated discrete time oscillator comprises a synchronous counter and a sigma-delta modulator. The sigma-delta modulator operating in a first clock receives the control signal to generate a divider pattern output. The divider pattern comprises a plurality of numbers, values of which are synchronous with the rate of the first clock. The synchronous counter operates in a second clock. In the synchronous counter, the second clock is divided by the divider pattern to generate the first clock. The frequency of the second clock is much higher than the frequency of the first clock. The clock divider receives the first clock and generates the feedback clock feedback to the phase detector.

DESCRIPTION OF THE DRAWINGS

The present invention is herein described by way of exemplary embodiments, but not limitations, illustrated in the accompanying drawings in which like references denote similar elements, and in which.

DETAILED DESCRIPTION OF THE INVENTION

Figure 1:
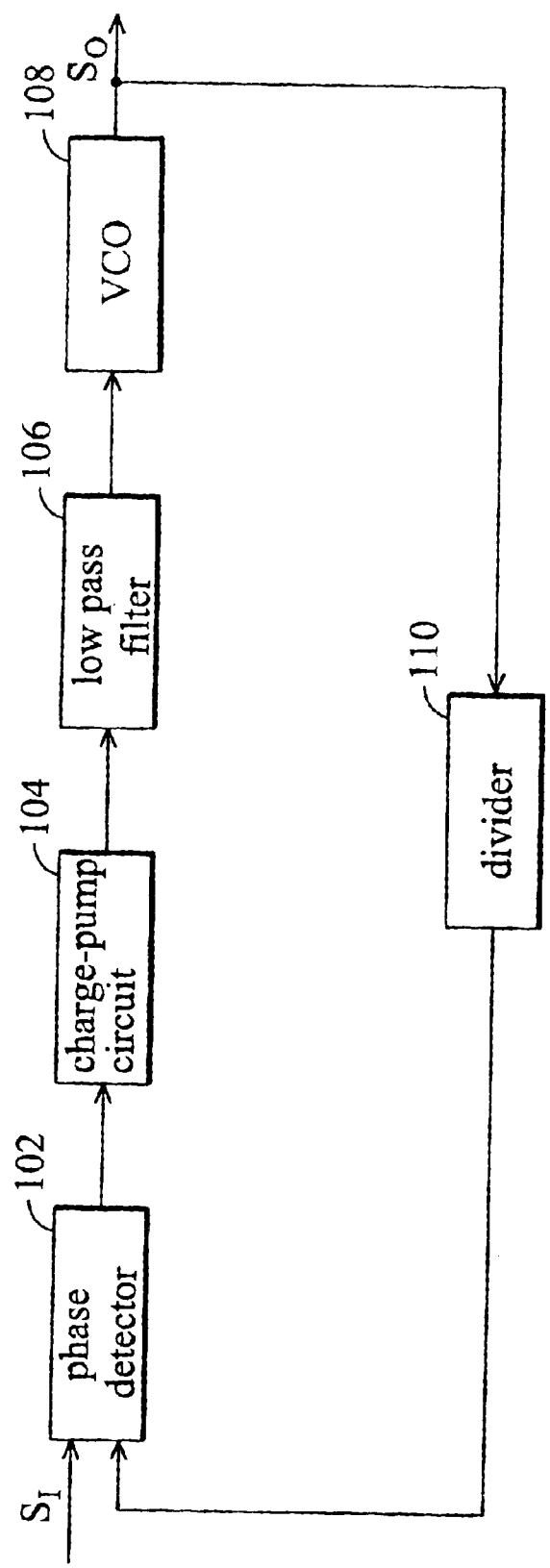
FIG. 1 is a block diagram illustrating a typical analog PLL system.
Figure 2:
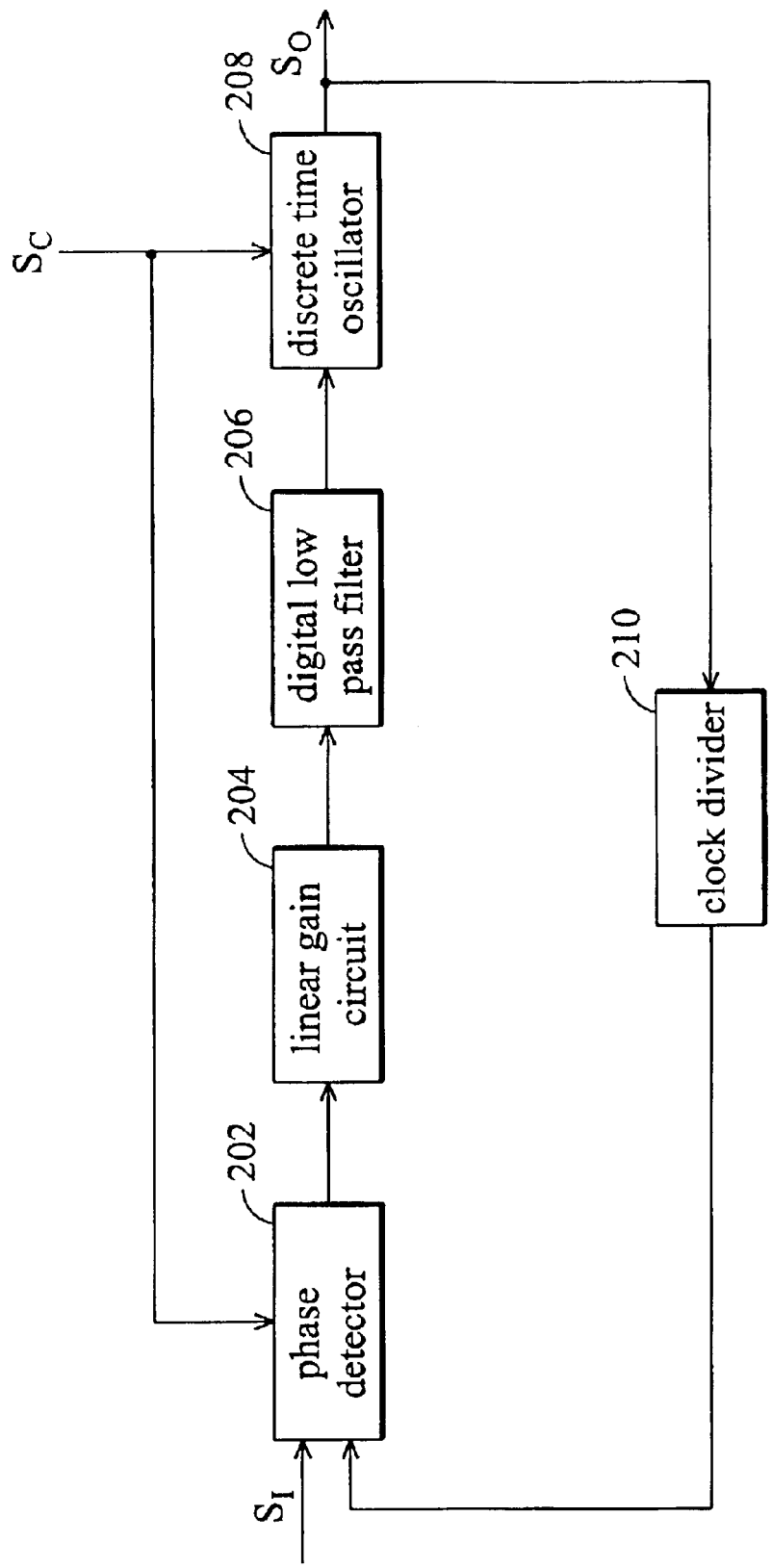
FIG. 2 is a block diagram illustrating a typical digital PLL system.
Figure 3A:
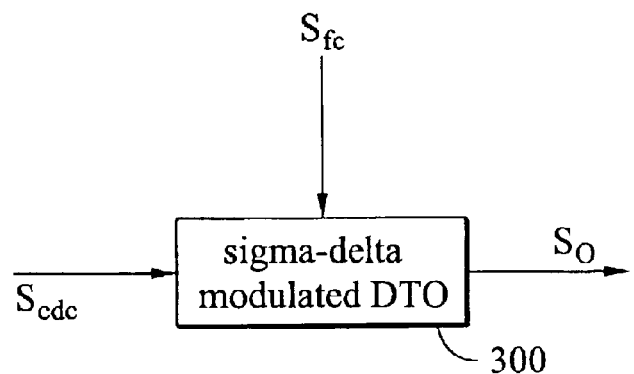
FIG. 3a is an open loop analysis of the sigma-delta modulated discrete time oscillator according to the embodiment of the invention.

FIG. 3a is an open loop analysis of the sigma-delta modulated discrete time oscillator (DTO) according to the embodiment of the invention. In the embodiment, a fast clock $S_{fc}$ with frequency of 140 MHz is supplied in a sigma-delta modulated DTO 300 to generate required pixel clock $S_o$ with frequency of 27 MHz by a clock divider with a divisor 5.1852 (100/27=5.1852). Thus, a control signal $S_{cdc}$ with value of 0.1852 is supplied to the sigma-delta modulated discrete time oscillator 300 to generate a clock divider pattern. The clock divider pattern emulates 5.1852 cycles of 140 MHz to produce 27 MHz. Eighteen percent of the clock divider pattern is 6. Seventy-two percent of the clock divider pattern is 5. The numbers of the clock divider pattern i.e. 5 and 6 are randomized. The sigma-delta modulator comprised in the sigma-delta modulated discrete time oscillator is proposed to perform the randomization.

Figure 3B:
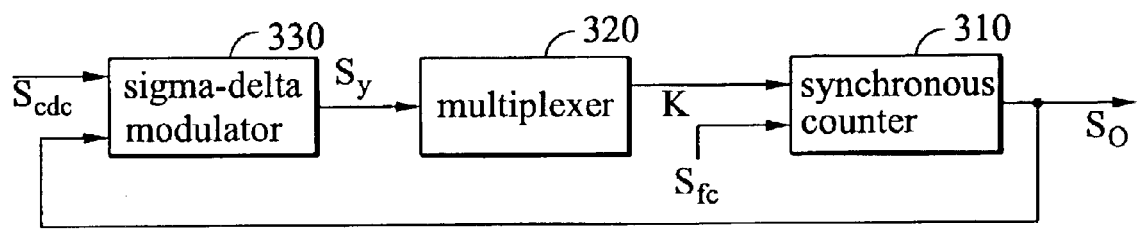
FIG. 3b is a block diagram illustrating the sigma-delta modulated discrete time oscillator according to the embodiment of the invention.

FIG. 3b is a block diagram illustrating the sigma-delta modulated discrete time oscillator according to the embodiment of the invention. The sigma-delta modulated DTO 300 comprises a synchronous counter 310, a multiplexer 320 and a sigma-delta modulator 330. The sigma-delta modulator 330 operates in the required pixel clock $S_o$ generated by the synchronous counter 310. In the embodiment, the frequency of the required pixel clock $S_o$ is 27 MHz.

The sigma-delta modulator 330 receives a control signal $S_{cdc}$ to generate a 1-bit signal $S_y$ output. The control signal $S_{cdc}$ provides a DC value for the frequency of the required pixel clock $S_o$. In the embodiment, the value is 0.1852 (referring to FIG. 6 for detailed illustration).

The value of the 1-bit signal $S_y$ controls the output number of the multiplexer 320. The synchronous counter 310 operates in a fast clock $S_{fc}$. In the embodiment, the frequency of the fast clock $S_{fc}$ is 140 MHz. In the synchronous counter 310, the fast clock $S_{fc}$ is divided by the output number of the multiplexer 320 to generate the required pixel clock. The synchronous counter 310 counts from 0 to K to reset. The value of K depends on the output number of the multiplexer 320. In the embodiment, the synchronous counter 310 needs to count 5 (from 0 to 4) or 6 (from 0 to 5). Thus, the output number of the multiplexer 320 may be either 4 or 5 depending on the value of the sigma-delta modulator 330 output.

Figure 4:
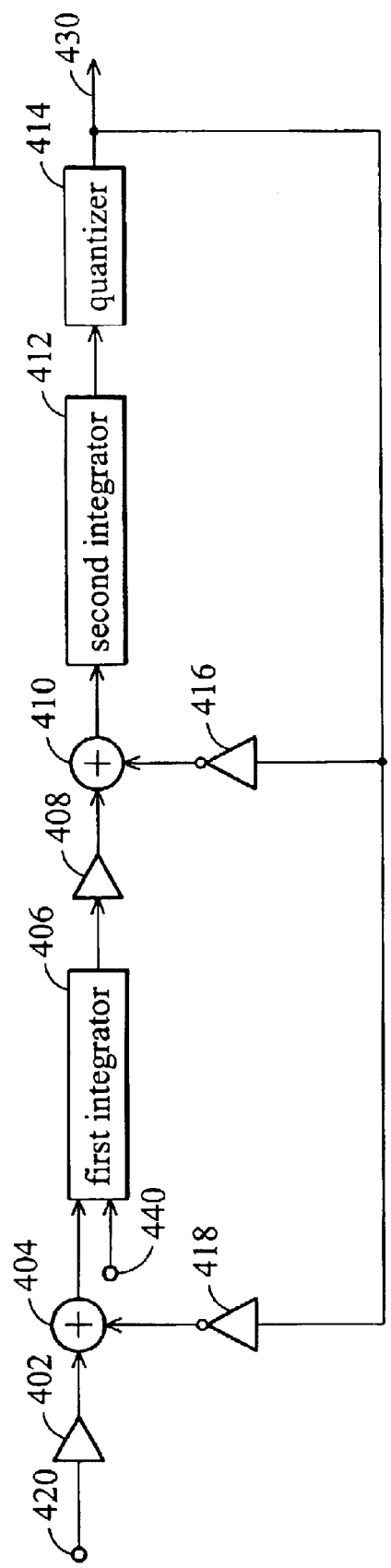
FIG. 4 is a block diagram illustrating an example of the sigma-delta modulator in the embodiment of the invention.

FIG. 4 is a block diagram illustrating an example of the sigma-delta modulator in the embodiment of the invention. The sigma-delta modulator receives a control signal $S_{cdc}$ from an input signal port 420 to generate a 1-bit signal $S_y$ to an output signal port 430. The sigma-delta modulator in the embodiment is a modulator having two integrators 406 and 412 between the input signal port 420 and a quantizer 414 therein. The integrators 406 and 412 receive the required pixel clock generated by the synchronous counter (referring to FIG. 3b) respectively. The number of integrators in the modulator is generally referred to as the order of the modulator.

The sigma-delta modulator includes a feedforward signal path, a first feedback signal path and a second feedback signal path. The feedforward signal path comprises a first gain unit 402, a first adder 404, the first integrator 406, a second gain unit 408, a second adder 410, the second integrator 412 and the quantizer 414. The first feedback signal path is from the output signal port 430 to the second adder 410 via a first inverting gain unit 416. The second feedback signal path is from the output signal port 450 to the first adder 404 via a second inverting gain unit 418.

In addition, the first gain unit 402 has a first gain factor (not shown in FIG. 4). The second gain unit 408 has a second gain factor (not shown in FIG. 4). The first inverting gain unit 416 has a third gain factor (not shown in FIG. 4). The second inverting gain unit 418 has a fourth gain factor (not shown in FIG. 4). The absolute values of the first gain factor, the second gain factor, the third gain factor and the fourth gain factor are less than 1.

While FIG. 4 illustrates the embodiment on a 2-order modulator, the invention is not limited in scope to this, and can be applied to any order of modulator.

Figure 5:
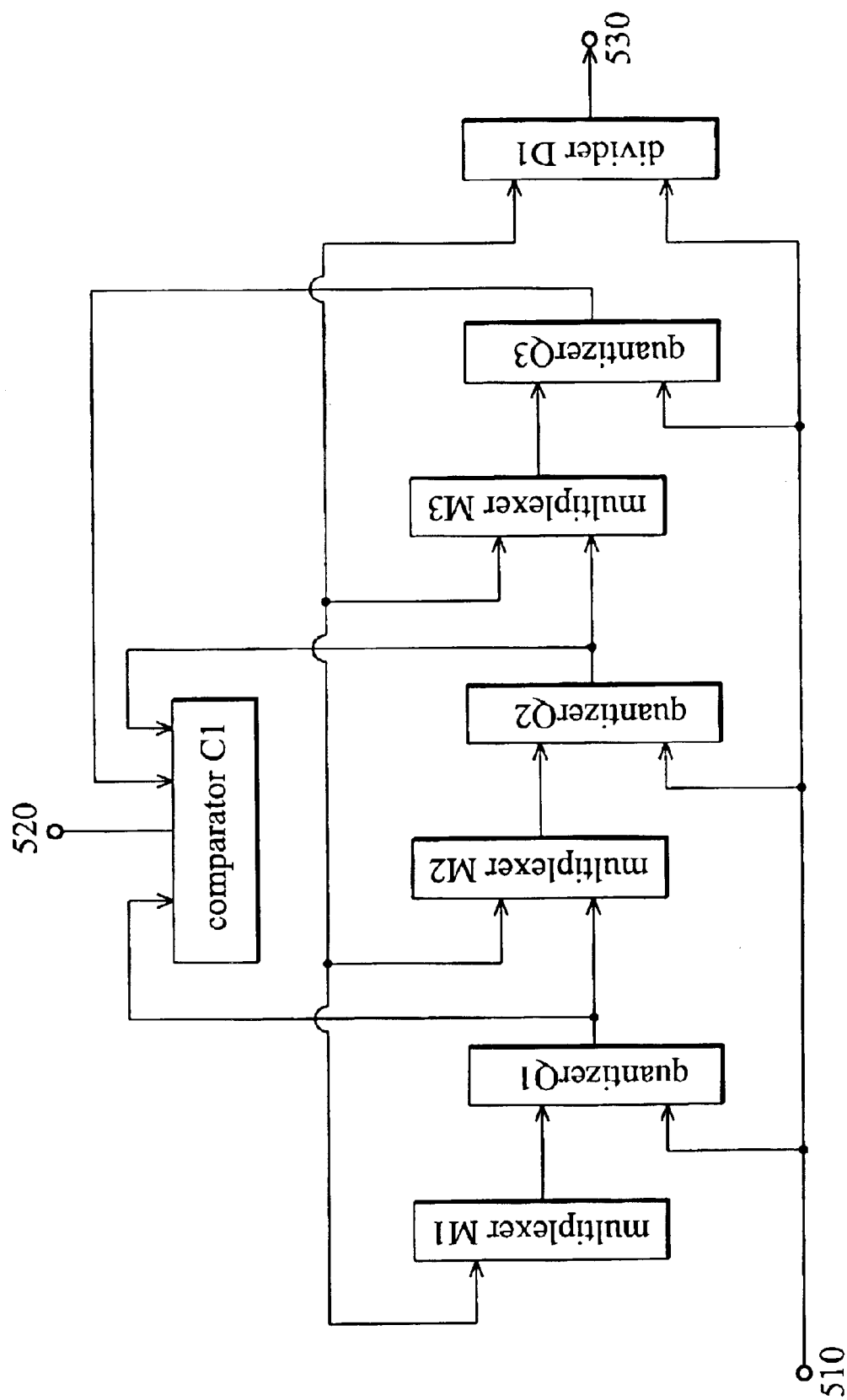
FIG. 5 is a block diagram illustrating an example of the synchronous counter in the embodiment of the invention.

FIG. 5 is a block diagram illustrating an example of the synchronous counter in the embodiment of the invention.

The synchronous counter operates in the fast clock with frequency of 140 MHz received from an input signal port 510. The synchronous counter counts from 0 to K to reset. A logic circuit comprises quantizers Q1, Q2 and Q3, multiplexers M1, M2 and M3, and a comparator C1 to count from 0 to K to reset. When counting to K, the counting logic circuit will be reset to 0 by a signal output from the comparator C1. The value of K depends on a signal input from an input port 520. The signal is the output number of the multiplexer (referring to FIG. 3b).

The signal output from the comparator C1 and the 140 MHz clock are input to a divider D1. The signal output from the comparator C1 is 5 or 6 in this embodiment. At the divider D1, the fast clock is divided by the signal output from the comparator C1 to generate the required pixel clock. The required pixel clock is output from an output signal port 530.

Figure 6:
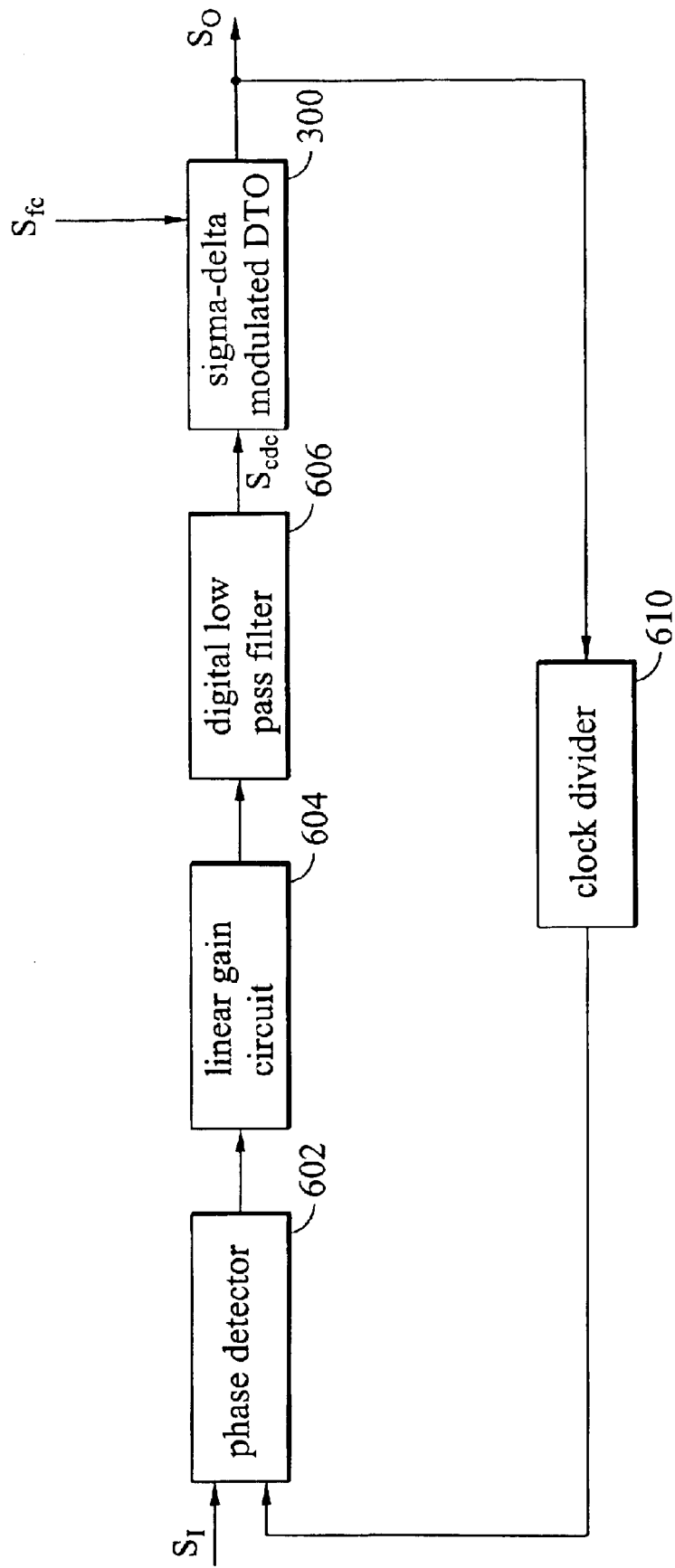
FIG. 6 is a block diagram illustrating a digital PLL system comprising the sigma-delta modulated discrete time oscillator shown in FIG. 3.

FIG. 6 is a block diagram illustrating a digital PLL system comprising the sigma-delta modulated discrete time oscillator shown in FIG. 3. As well as comprising the sigma-delta modulated discrete time oscillator (DTO) 300 shown in FIG. 3, the digital PLL system 600 comprises a phase detector 602, a linear gain circuit 604, a digital low pass filter 606 and a clock divider 610.

The phase detector 602 receives a referenced clock $S_I$ and a feedback clock to find a phase error output. In the embodiment, the frequency of the referenced clock $S_I$ is 15.73426 kHz. The referenced clock $S_I$ may be output from a Hsync signal generator. The phase error is represented to a counter value. The phase detector 602 uses the referenced clock rising edge to latch the phase error.

The linear gain circuit 604 is coupled between the phase detector 602 and the digital low pass filter 606. The linear gain circuit 604 receives the phase error to generate a digital value and outputs the digital value to the digital low pass filter.

The digital low pass filter 606 receives the digital value output from the linear gain circuit 604 to generate a control signal $S_{cdc}$. The control signal $S_{cdc}$ is considered as almost a DC value for a required pixel clock $S_o$ with frequency of 27 MHz. In the embodiment, when the system is locked, the DC value is 0.1852.

The sigma-delta modulated discrete time oscillator 300 receives a fast clock $S_{fc}$ and the control signal $S_{cdc}$ to generate the required pixel clock $S_o$. In the embodiment, the frequency of the fast clock $S_{fc}$ is 140 MHz. The fast clock $S_{fc}$ is generated form another analog phase-locked loop circuit (not shown in FIG. 6).

The clock divider 610 receives the required pixel clock $S_o$ output from the sigma-delta modulated discrete time oscillator 300 and generates the feedback clock feedback to the phase detector 602. In the embodiment, the clock divider 610 counts to 1715 then resets to 0. The phase detector 602 uses the center value i.e. 858 for the phase reference. When the phase lags i.e. the counter value is smaller than 858, the system needs to generate a faster required pixel clock, and the value of the control signal $S_{cdc}$ is then increased. When the phase lead i.e. the counter value is smaller than 858, the system needs to generate a faster required pixel clock, and the value of the control signal $S_{cdc}$ is then increased. When the system is locked, the counter value is latched to 858. Since the frequency of the feedback clock is very close to the frequency of the referenced clock, in tracking mode, update of the control signal $S_{cdc}$ requires very low gain.

Furthermore, the sigma-delta modulated discrete time oscillator 300 generates high frequency noise. The required pixel clock $S_o$ generated by the sigma-delta modulated discrete time oscillator 300 contains the high frequency component. The high frequency component is absorbed by a clock divider with a large divisor. Thus, the high frequency component can be filtered by the clock divider 610 with the divisor id 1716.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sigma-delta modulated discrete time oscillator, comprising:
 a sigma-delta modulator, operating in a first clock, for receiving a control signal to generate a divider pattern output, wherein the divider pattern comprises a plurality of numbers, values of which are synchronous with the rate of the first clock; and
 a synchronous counter, operating in a second clock, for dividing the second clock by the divider pattern to generate the first clock, wherein the frequency of the second clock is much higher than the frequency of the first clock;
 wherein the control signal provides a DC value for the frequency of the first clock.

2. The sigma-delta modulated discrete time oscillator of claim 1 further comprising:
 an analog phase-locked loop with an internal loop filter for generating the second clock.

3. The sigma-delta modulated discrete time oscillator of claim 1 wherein the sigma-delta modulator is a second order single-bit sigma-delta modulator.

4. The sigma-delta modulated discrete time oscillator of claim 1 wherein the synchronous counter counts from 0 to K to reset, wherein the value of K depends on the values of the numbers constituting the divider pattern.

5. A phase-locked loop system, comprising:
 a phase detector for receiving a referenced clock and a feedback clock to find a phase error output;
 a digital low pass filter coupled to the phase detector, for receiving the phase error to generate a control signal, wherein the control signal provides a DC value for a frequency of a first clock;
 a sigma-delta modulated discrete time oscillator, comprising:
  a sigma-delta modulator, operating in the first clock, for receiving a control signal to generate a divider pattern output, wherein the divider pattern comprises a plurality of numbers, values of which are synchronous with the rate of the first clock; and
  a synchronous counter, operating in a second clock, for dividing the second clock by the divider pattern to generate the first clock, wherein the frequency of the second clock is much higher than the frequency of the first clock; and
 a clock divider for receiving the first clock, generating the feedback clock feedback to the phase detector.

6. The phase-locked loop system of claim 5 wherein the phase error is represented by a counter difference.

7. The phase-locked loop system of claim 6 wherein the sigma-delta modulated discrete time oscillator further comprises:
 a linear gain circuit coupled between the phase detector and the digital low pass filter, for receiving the phase error to generate a digital value and outputting the digital value to the digital low pass filter.

8. The phase-locked loop system of claim 5 wherein the sigma-delta modulated discrete time oscillator further comprises:
 an analog phase-locked loop with an internal loop filter for generating the second clock.

9. The phase-locked loop system of claim 5 wherein the sigma-delta modulator is a second order single-bit sigma-delta modulator.

10. The phase-locked loop system of claim 5 wherein the synchronous counter counts from 0 to K to reset, and the value of K depends on the values of the numbers constituting the divider pattern.

* * * * *